(12) United States Patent
Yoshida

(10) Patent No.: US 6,518,799 B2
(45) Date of Patent: Feb. 11, 2003

(54) COMPARATOR AND A CONTROL CIRCUIT FOR A POWER MOSFET

(75) Inventor: Mitsuru Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/891,236

(22) Filed: Jun. 27, 2001

(65) Prior Publication Data

US 2002/0000844 A1 Jan. 3, 2002

(30) Foreign Application Priority Data

Jun. 28, 2000 (JP) ........................................ 2000-193788

(51) Int. Cl.[7] ................................................. H03K 5/22
(52) U.S. Cl. ........................................... 327/77; 327/89
(58) Field of Search ............................... 327/77–81, 85, 327/88, 89, 109, 427, 434, 435, 560–563, 53, 143, 198

(56) References Cited

U.S. PATENT DOCUMENTS

| | | | | |
|---|---|---|---|---|
| 4,240,039 A | * | 12/1980 | Mihalich | ..................... 330/253 |
| 4,243,945 A | * | 1/1981 | Eckert | ......................... 330/253 |
| 4,885,477 A | * | 12/1989 | Bird et al. | ..................... 327/52 |
| 6,184,721 B1 | * | 2/2001 | Krymski | ....................... 327/52 |
| 6,316,971 B1 | * | 11/2001 | Ohashi | ......................... 327/74 |
| 6,320,429 B1 | * | 11/2001 | Yano | ............................ 327/77 |

* cited by examiner

Primary Examiner—Toan Tran
(74) Attorney, Agent, or Firm—Foley & Lardner

(57) ABSTRACT

A control circuit for a power MOSFET includes a voltage divider for dividing an input voltage, a fixed voltage generator for generating a fixed voltage, a comparator having a differential pair including first and second depletion transistors each receiving the divided voltage or the fixed voltage and a current mirror including first and second enhancement transistors connected in series with the first and second depletion transistors, respectively, an inverter for receiving the output from the comparator, and a power MOSFET controlled for the ON/OFF control thereof by the inverter.

11 Claims, 2 Drawing Sheets

US 6,518,799 B2

COMPARATOR AND A CONTROL CIRCUIT FOR A POWER MOSFET

BACKGROUND OF THE INVENTION (a) Field of the Invention

The present invention relates to a comparator and a control circuit for controlling a power MOSFET (metal-oxide-semiconductor field effect transistor).

(b) Description of the Related Art

Power MOSFETs are used in a variety of applications in a power supply circuit. FIG. 1 is a circuit diagram showing a conventional control circuit for controlling a power MOSFET.

The control circuit includes an N-channel depletion FET MD10, N-channel enhancement FETs ME 10 and ME 11, high-resistance resistors R 10 to 12 made of polycrystalline silicon films, and a power MOSFET PoMOSFET.

In FIG. 1, the control circuit includes first through third serial branches. The first serial branch has the high-resistance resistors R11 and R12 of polycrystalline silicon films, connected in series between the input terminal IN and the ground terminal GND. The second serial branch has the N-channel depletion FET MD10 and the N-channel enhancement FET ME10 connected in series between the input terminal IN and the ground terminal GND. The third serial branch has the high-resistance resistor R12 of polycrystalline silicon film and the N-channel enhancement FET ME11 connected in series between the input terminal IN and the ground GND.

In addition, the node connecting the resistors R10 and R11 is connected to the gate of the N-channel enhancement FET ME10. The connection node of the high-resistance resistor R12 and the drain terminal of the N-channel enhancement FET ME11 is connected to the gate terminal of the power MOSFET. In addition, the gate terminal of the N-channel enhancement FET ME11 is connected to the drain terminal of the N-channel enhancement FET ME10.

In the control circuit arranged as described above, the first serial branch acts as an input voltage divider circuit, the second serial branch acts as a reference voltage circuit, and the third serial branch acts as an inverter circuit. The output terminal OUT or the drain of the power MOSFET is connected to a load not shown.

In FIG. 1, the voltage V10 is obtained by dividing the input voltage VIN by using the high-resistance resistors R10 and R11 and is changed in accordance with the level of the input voltage VIN. Thus, the following equation holds:

$$V10 = \{R11/(R10+R11)\} \cdot VIN.$$

A variation in the voltage V10 is compared against the threshold voltage Vt of the N-channel enhancement FET ME10. If the input voltage VIN is lower compared to a specified voltage, an output voltage Vg2 of the inverter circuit assumes a low level since V10<Vt of ME10 holds. On the other hand, if the input voltage VIN is higher compared to the specified voltage, the output voltage Vg2 of the inverter circuit assumes a high level since V10>Vt of ME10 holds. In this case, the high voltage Vg2 applied to the gate terminal of the power MOSFET turns on the power MOSFET to flow a current through the load.

FIG. 2 is a graph showing the voltage characteristic of each portion of the control circuit of FIG. 1 against the input voltage VIN during performing the gate control of the power MOSFET based on the input voltage VIN. It is to be noted that the N-channel enhancement FET ME10 has a threshold voltage Vt of about 0.6V, whereas the power MOSFET has a threshold voltage Vtp of about 1.2V. In FIG. 3, if the resistor R10 has a resistance of 300 kΩ and the resistor R11 has a resistance of 140 kΩ, with the input voltage VIN being at about 2V, the node V10 has a voltage of about 0.6V to turn on the N-channel enhancement FET ME10. In this case, the gate voltage Vg2 of the power MOSFET assumes a high level.

As described above, in the conventional control circuit having a comparator function therein, the threshold voltage Vt of the N-channel enhancement FET ME10 is employed as a reference voltage, which is compared against the voltage V10 obtained by dividing the input voltage VIN with the high-resistance resistors R10 and R11 of polycrystalline silicon films to perform the gate control of the power MOSFET.

In the conventional control circuit, however, there was a drawback in that the control voltage for controlling ON/OFF of the power MOSFET is varied depending on the variation of the threshold voltage Vt of the N-channel enhancement FET.

For example, in FIG. 2, with a variation in the threshold voltage Vt of the N-channel enhancement FET ME10 being within a range of ±0.2V, the control voltage $V_{TH}$ for controlling ON/OFF of the power MOSFET significantly varies within a range of about ±0.5V, as shown in FIG. 2. Taking also the variation of the ON-current of the N-channel depletion FET MD10 into consideration, the control voltage $V_{TH}$ for controlling the ON/OFF of the power MOSFET varies in a higher range of ±1.0V or more.

SUMMARY OF THE INVENTION

It is therefore an object of the present invention to solve the aforementioned conventional drawback to provide a control circuit having a reduced variation in the control voltage for controlling ON/OFF of the power MOSFET by using a new configuration of a comparator. The present invention also relates to such a comparator.

The present invention provides a comparator comprising:

a differential pair including a pair of depletion transistors each having a gate for receiving one of a signal pair; and a current mirror including a pair of enhancement transistors each connected in series with a corresponding one of the depletion transistors, a drain of one of the enhancement transistors forming an output terminal for outputting a result of comparison between the signal pair by the comparator.

In accordance with the control circuit of the present invention having a new comparator, variations in the control voltage for ON/OFF control can be reduced.

The present invention also provides a control circuit comprising:

a voltage divider for diving an input voltage to input a divided voltage;

a fixed voltage generator for generating a fixed voltage:

a differential pair including first and second depletion transistors, the first depletion transistor having a gate for receiving the divided voltage, the second depletion transistor having a gate for receiving the fixed voltage, a current mirror including first and second enhancement transistors, the first enhancement transistor being connected in series with the first depletion transistor, the second enhancement transistor being connected in series with the second depletion transistor, a drain of one of the first and second enhancement transistors outputting a result signal indicating a result of comparison between the fixed voltage and the divided voltage; and a first MOSFET having a gate controlled by the result signal.

In accordance with the control circuit of the present invention having a new comparator, a variation in the control voltage for ON/OFF control can be reduced by the function of the comparator having a new configuration.

The above and other objects, features and advantages of the present invention will be more apparent from the following description, referring to the accompanying drawings.

DETAILED DESCRIPTION OF THE PREFERRED EMBODIMENT

Now, the present invention will be described below in more detail with reference to the accompanying drawings in accordance with the preferred embodiment thereof.

Figure 1:
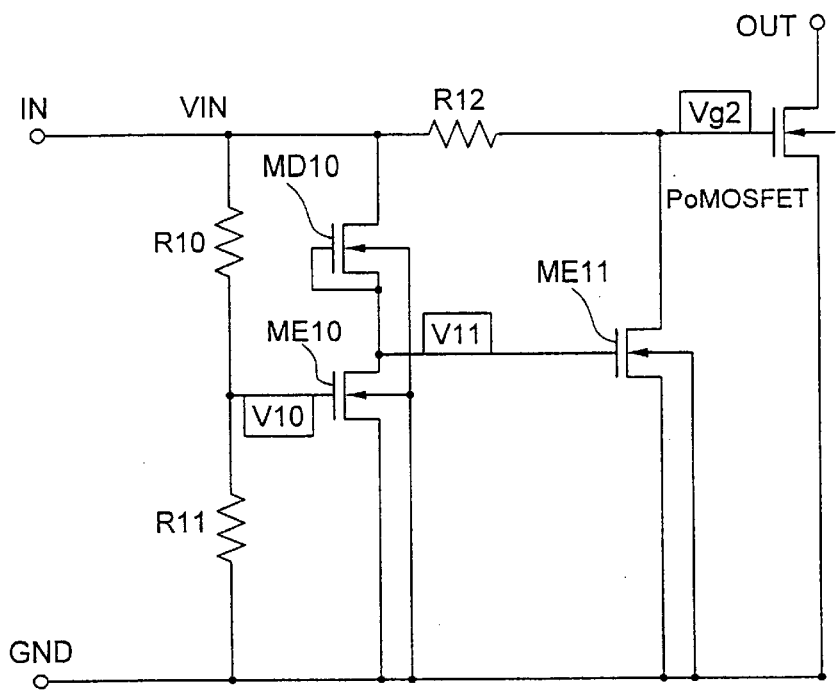
FIG. 1 is a circuit diagram of a conventional control circuit.
Figure 2:
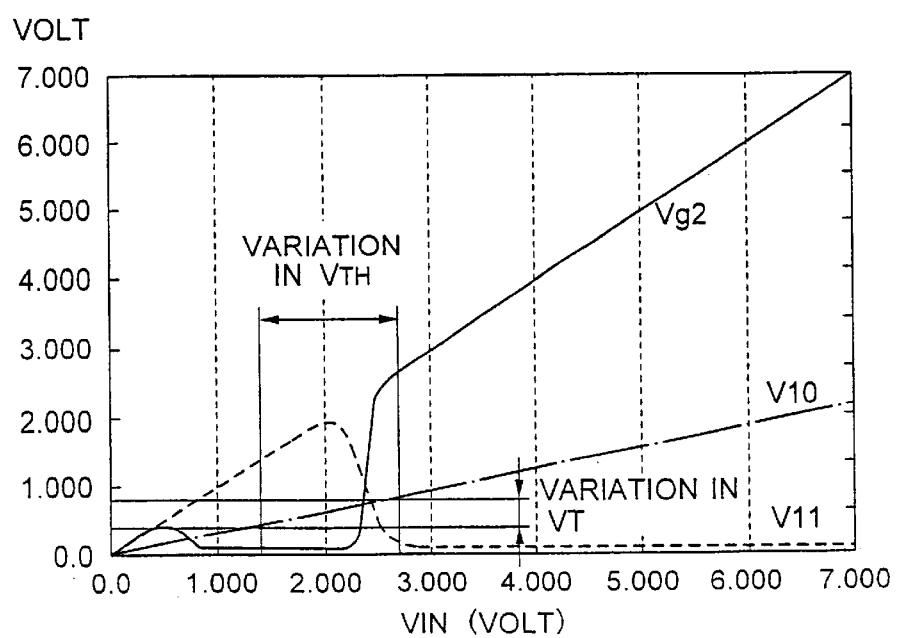
FIG. 2 is a graph showing the characteristic of a variation in the voltage of each portion of the conventional control circuit with respect to the input voltage.
Figure 3:
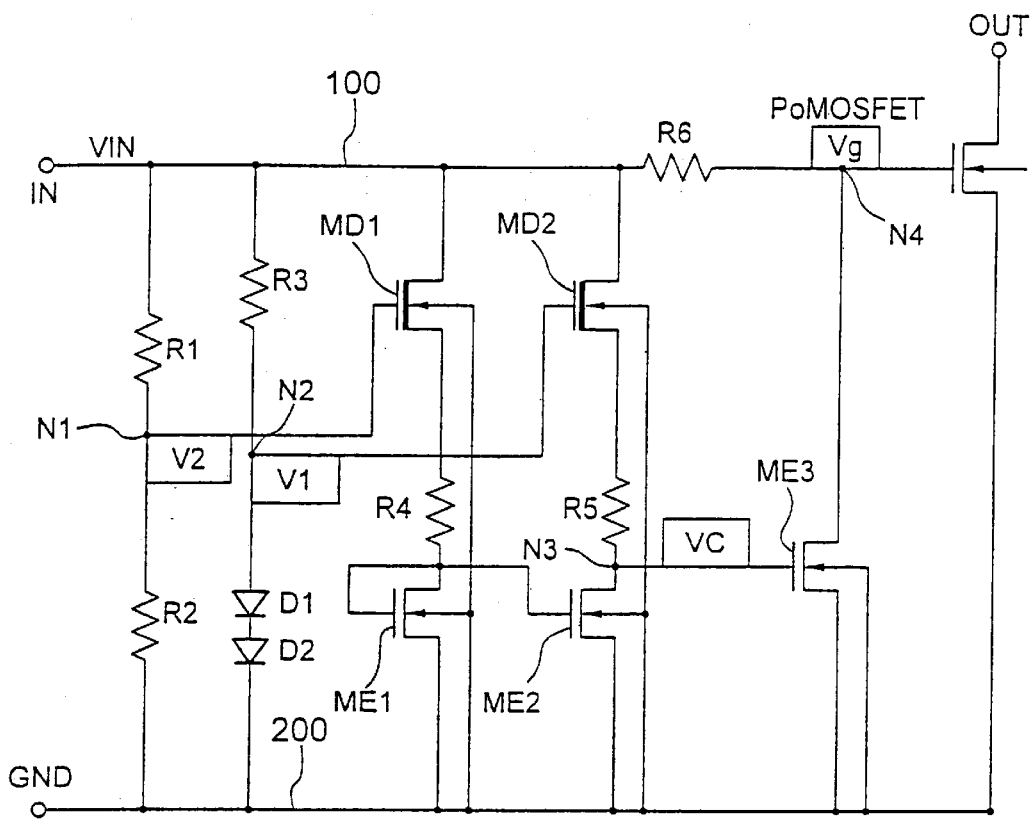
FIG. 3 is a circuit diagram of a control circuit having a comparator according to an embodiment of the present invention.

Referring to FIG. 3, there is shown a control circuit having a comparator according to the present embodiment. The control circuit is used for activating a power MOSFET, after the input voltage VIN reaches a predetermined voltage, to flow a current through a load connected to an output terminal OUT. The control circuit includes first and second polycrystalline silicon film resistors R1 and R2 for forming a voltage divider, which divides the input voltage VIN applied between the input terminal IN and the ground GND. The output node N1 of the voltage divider is used to output a first voltage V2 at a node N1 for detecting the magnitude of the input voltage applied to the input terminal IN.

The control circuit also includes a third polycrystalline silicon film resistor R3 and polycrystalline silicon diodes D1 and D2, which are connected in series between the input terminal IN and the ground GND to generate a reference voltage. The node N2 connecting the cathode of the diode D1 and the resistor R3 is used to output a fixed voltage or reference voltage V1. The control circuit also includes a first depletion FET MD1 having a gate connected to the node N1 and a drain connected to the input terminal IN, or a input source line 100.

The control circuit further includes a second depletion FET MD2 having a gate connected to the node N2 and a drain connected to the input terminal IN. The control circuit further includes a first enhancement FET ME1 having a gate and a drain connected to each other, with the drain thereof being connected to the source of the first depletion FET MD1 via a fourth resistor R4 of polycrystalline silicon film and the source thereof being connected to the ground GND. The control circuit further includes a second enhancement FET ME2 having a gate connected to the drain of the first enhancement FET ME1, a drain connected to the source of the second depletion FET (MD2) via a fifth resistor R5 of polycrystalline silicon film, and a source connected to the ground GND. The control circuit further includes a sixth resistor R6 of polycrystalline silicon film connected between the input terminal IN and the gate of the power MOSFET. The control circuit further includes a third enhancement FET ME3 having a gate connected to the drain of the second enhancement FET ME2 at a node N3, a drain connected to the gate of the power MOSFET, and a source connected to the ground GND.

The first depletion FET MD1 receives the first voltage V2 at the gate thereof. The second depletion FET (MD2) receives the fixed voltage V1 at the gate thereof. The first enhancement FET ME1 and the second enhancement FET form a current mirror, the sources thereof being connected to the ground GND or a ground line 200. Thus, in the control circuit, a comparator is formed by the differential transistor pair including the depletion transistors MD1 and MD2, the current mirror including the enhancement transistors ME1 and ME2 and the resistors R4 and R5. The comparator compares the first voltage V2 with the fixed voltage V1. The output of the comparator is supplied to the gate of the third enhancement FET ME3 through the drain of the second depletion FET MD2.

The control circuit according to the present embodiment shown in FIG. 3 allows the comparator having the current mirror to compare the fixed voltage V1 output at the node N1 independently of the input voltage against the first voltage V2 obtained by dividing the input voltage VIN in the voltage divider at the node N2, and then outputs the result of the comparison as a voltage VC at the node N3.

A control voltage Vg is output via an inverter circuit including the N-channel enhancement FET ME3 and the high-resistance resistor R6 of polycrystalline silicon film. The control voltage Vg is applied to the gate terminal of the power MOSFET, thereby making it possible to control ON/OFF of the power MOSFET.

When the first voltage V2 at the node N1 is lower than the fixed voltage V1 at the node N2, that is, the input voltage is lower than the specified voltage, the source/drain voltage of the depletion FET MD1 is higher than that of the depletion FET MD2. This causes the voltage at the node N3, that is, the gate voltage of the enhancement FET ME3, to assume a high level and thus allows the enhancement FET ME3 to be turned on. Consequently, the voltage Vg at the node N4 assumes a low level to turn off the power MOSFET.

As the input voltage VIN increases at the input terminal IN, the source/drain voltage of the depletion FET MD2 becomes higher than the source/drain voltage of the depletion FET MD1. This causes the voltage VC at the node N3, that is, the gate voltage of the enhancement FET ME3, to assume a low level, and thus allows the enhancement FET ME3 to be turned off. Consequently, the voltage VC at the node N4 assumes a high level, causing the power MOSFET to be activated or turned ON.

Figure 4:
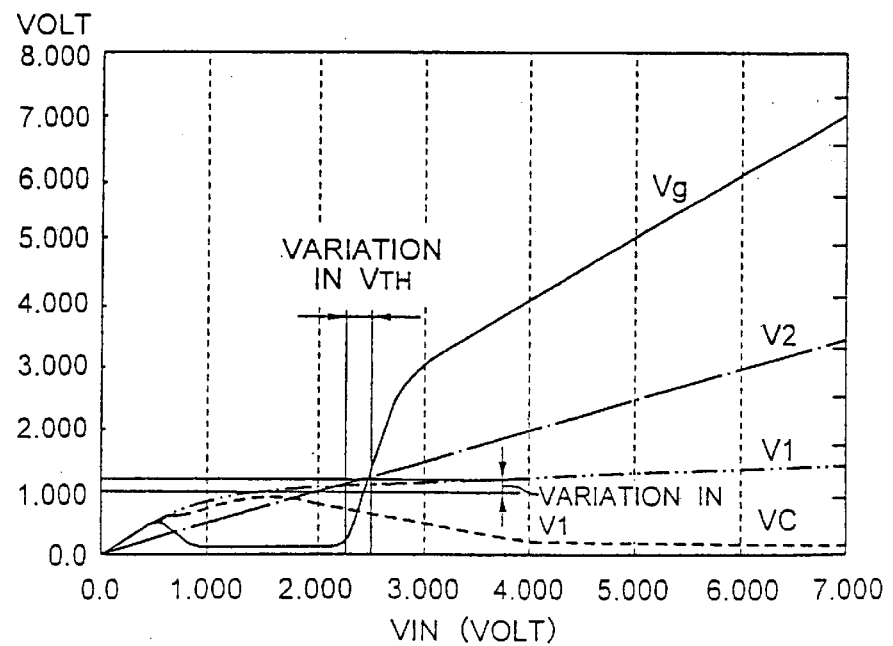
FIG. 4 is a graph showing the characteristics of a variation in the voltage of each portion of the control circuit of FIG. 3.

Referring to FIG. 4, there is shown a graph depicting the voltage of each node against the input voltage in the control circuit of FIG. 3, during performing the gate control of the power MOSFET. Voltage V1 is a fixed voltage that is output independently of the input voltage VIN and equal to about 1.2V in this specific example of the present embodiment. Voltage V2 is obtained by dividing the input voltage in the voltage divider and thus is in a linear relationship with respect to the input voltage VIN. At the input voltage at which the voltage V2 becomes higher than the fixed voltage V1 (or about 2.3V in this specific example), the output voltage VC of the comparator assumes a low level and the output voltage Vg of the inverter assumes a high level. In this case, a positive voltage Vg is applied to the gate terminal of the power MOSFET, causing the power MOSFET to be turned on. In this example, the threshold Vt of the enhancement FET is at about 0.6V and the threshold voltage of the power MOSFET is at about 1.2V.

The variations of the ON/OFF control voltage in the control circuit are mainly caused by a variation in the reference voltage or fixed voltage V1 resulting from a variation in the forward voltage drop VF of the polycrystalline silicon diodes D1 and D2 and variations of the resistances of the polycrystalline silicon resistor R3. The variation in the reference voltage V1 resulting from the variations in the forward voltage drop VF of the diodes and the variation of the resistance of the resistors is generally within a range of about ±0.1V, and thus the power MOSFET has a variation in the gate control voltage which is as low as ±0.2V.

It is to be noted that the present invention is not limited to the N-type semiconductor substrate having N-ch transistors thereon, and applicable to a P-type semiconductor substrate having P-ch transistors thereon.

Since the above embodiments are described only for examples, the present invention is not limited to the above embodiments and various modifications or alterations can be easily made therefrom by those skilled in the art without departing from the scope of the present invention.

What is claimed is:

1. A comparator comprising:
    a differential pair including first and second depletion transistors, the first and second depletion transistors each having a gate for receiving one of an input signal pair, and the first and second depletion transistors each having a source;
    a threshold voltage generator formed by a resistor and at least one diode, the resistor and the at least one diode being connected to the gate of the second depletion transistor; and
    a current mirror including a pair of enhancement transistors, each enhancement transistor having a drain that is connected to one of said sources of said first and second depletion transistors, wherein one of said drains of said enhancement transistors forms an output terminal for outputting a result of a comparison between said signal pair by said comparator.

2. The comparator as defined in claim 1, further comprising a pair of resistors each connected between a corresponding one of said depletion transistors and a corresponding one of said enhancement transistors.

3. The comparator as defined in claim 2, wherein each of said resistors is implemented by a polycrystalline silicon film.

4. A control circuit comprising:
    a voltage divider for dividing an input voltage to output a divided voltage;
    a threshold voltage generator for generating a threshold voltage, said threshold voltage generator formed by a resistor and at least one diode;
    a differential pair including first and second depletion transistors, said first depletion transistor having a gate for receiving said divided voltage, said second depletion transistor having a gate connected to said resistor and said at least one diode of said threshold voltage generator,
    a current mirror including first and second enhancement transistors, said first enhancement transistor having a drain that is connected to a source of said first depletion transistor, said second enhancement transistor having a drain that is connected to a source of said second depletion transistor, one of said drains of said first and second enhancement transistors outputting a result signal indicating a result of a comparison between said threshold voltage and said divided voltage; and
    a first MOSFET having a gate controlled by said result signal.

5. The control circuit as defined in claim 4, wherein said first MOSFET is a third enhancement FET.

6. The control circuit as defined in claim 5, wherein said first MOSFET controls a gate potential of a power MOSFET.

7. The control circuit as defined in claim 4, wherein said diode is made of polycrystalline silicon.

8. The comparator of claim 1, wherein
    the drain of the first enhancement transistor is connected to the source of the first depletion transistor through a first current mirror resistor; and
    the drain of the second enhancement transistor is connected to the source of the second depletion transistor through a second current mirror resistor.

9. The comparator of claim 1, wherein the input signal pair on the gates of the first depletion transistor and the second depletion transistor is derived from a source voltage.

10. The control circuit of claim 4, wherein
    said drain of said first enhancement transistor is connected to said source of said first depletion transistor through a first current mirror resistor; and
    said drain of said second enhancement transistor is connected to said source of said second depletion transistor through a second current mirror resistor.

11. The control circuit of claim 4, wherein said input voltage and said threshold voltage are derived from a source voltage.

* * * * *